US006878411B2

(12) United States Patent
Manz

(10) Patent No.: US 6,878,411 B2
(45) Date of Patent: Apr. 12, 2005

(54) BATH FOR THE ELECTROCHEMICAL DEPOSITION OF HIGH-GLOSS WHITE RHODIUM COATINGS AND WHITENING AGENT FOR THE SAME

(75) Inventor: Uwe Manz, Aalen (DE)

(73) Assignee: Umicore Galvanotechnik GmbH, Hanau-Wolfgang (DE)

( * ) Notice: Subject to any disclaimer, the term of this patent is extended or adjusted under 35 U.S.C. 154(b) by 0 days.

(21) Appl. No.: 10/168,241

(22) PCT Filed: Dec. 15, 2000

(86) PCT No.: PCT/EP00/12796

§ 371 (c)(1), (2), (4) Date: Oct. 14, 2002

(87) PCT Pub. No.: WO01/48273

PCT Pub. Date: Jul. 5, 2001

(65) Prior Publication Data

US 2003/0111352 A1 Jun. 19, 2003

(30) Foreign Application Priority Data

Dec. 23, 1999 (DE) ........................................ 199 62 839

(51) Int. Cl.[7] .......................... B05D 1/18; C23C 16/00; C23C 18/00; C25D 3/00

(52) U.S. Cl. .................. 427/430.1; 427/436; 106/1.24; 106/1.28; 205/261

(58) Field of Search .............................. 106/1.24, 1.28; 427/430.1, 437, 436; 205/261

(56) References Cited

U.S. PATENT DOCUMENTS 3,780,198 A * 12/1973 Pahl et al. .................. 426/477
4,173,178 A * 11/1979 Wieland .................... 99/323.1
4,402,802 A * 9/1983 Kreuter et al. .............. 205/264
5,329,975 A * 7/1994 Heitel ......................... 141/19

FOREIGN PATENT DOCUMENTS

EP 682979 A1 * 11/1995 ............. B01F/3/04
FR 2293968 A * 8/1976 ............. B01F/3/04
JP 52024131 A * 2/1977 ............ C25D/3/50
WO WO 0007706 A1 * 2/2000

OTHER PUBLICATIONS

References A–C and N–P were cited on the International Search Report.*

* cited by examiner

*Primary Examiner*—Edna Wong
(74) *Attorney, Agent, or Firm*—Kalow & Springut LLP

(57) ABSTRACT

The invention concerns a bath for the electrochemical deposition of high-gloss white rhodium coatings and a whitening agent for the same. The brightness or degree of whiteness of the deposited coatings is significantly increased by means of compounds having the formula $R—SO_m—H$, wherein m is the numbers 3 or 4 and R is a straight-chain or branched chain or cyclic alkyl group having up to 20 C atoms, as a whitening agent. The thickness of the coating that can be deposited without a bloom is also significantly increased.

9 Claims, No Drawings

BATH FOR THE ELECTROCHEMICAL DEPOSITION OF HIGH-GLOSS WHITE RHODIUM COATINGS AND WHITENING AGENT FOR THE SAME

The invention concerns an electroplating bath for the deposition of high-gloss white rhodium coatings and a whitening agent for the same.

Rhodium coatings are deposited onto silver e.g. as a tarnish preventive and should exhibit high gloss and as bright, white a colour as possible, similar to that of silver.

Commercial electrolytes are composed on the basis of rhodium sulfate, phosphate or sulfamate, sulfuric acid, phosphoric acid, alkane sulfonic acid or amidosulfonic acid.

In order to be able to deposit bloom-free coatings from such baths, they conventionally contain certain organic compounds as brightening additives. Typical brightening additives that are very commonly used, as described in EP 0 056 590, for example, are the compounds pyridine-3-sulfonic acid and naphthaline trisulfonic acid. To prevent hydrogen from adhering to the cathode, a wetting agent and/or a phosphonic acid can additionally be contained in such a bath.

A disadvantage of the existing systems lies in the fact that the very bright, white colour of silver is not achieved and that as the film thickness increases deposition occurs with a greater bloom.

The object of the invention was therefore to achieve an improvement in such rhodium baths in the respect that the deposited coatings are significantly whiter and the brightness or degree of whiteness is markedly closer to silver. The thickness of film that can be deposited without a bloom should also be increased.

Surprisingly it has been found that this can be achieved if at least one compound having the general formula I $$R\text{-}SO_m\text{—}H \quad (I)$$

wherein m is the numbers 3 or 4 and

R is a straight-chain or branched or cyclic alkyl group having up to 20 C atoms is added as whitening agent to such baths for the deposition of rhodium coatings.

The invention thus provides a bath for the electrochemical deposition of high-gloss white rhodium coatings, containing rhodium in dissolved form optionally with an organic compound as brightening additive, characterised in that the bath contains as whitening agent at least one compound having the general formula $$R\text{-}SO_m\text{—}H \quad (I)$$

wherein m is the numbers 3 or 4 and

R is a straight-chain or branched or cyclic alkyl group having up to 20 C atoms.

The whitening agents according to formula I are selected compounds from the class of alkyl sulfates or alkyl sulfonates. In formula I R denotes a straight-chain or branched or cyclic alkyl group having up to 20 C atoms.

The compounds having formula I are known per se and readily available.

These compounds are adequately water-soluble and compatible with the electroplating bath. The compounds have surfactant properties, whereby the corresponding action is reduced if the total number of C atoms is less than 4 and the solubility is generally no longer adequate if the total number of C atoms is greater than 20.

Preferred brightening additives are compounds having formula I in which R stands for straight-chain or branched or cyclic alkyl groups having 5 to 12 C atoms and in particular for branched alkyl groups having 6 to 10 C atoms.

Branched compounds are suitable because of their only slightly pronounced foaming tendency, particularly in processes and equipment in which severe foaming would be disruptive, e.g. in air-operated electrolytes, in drum processing, in high-speed deposition equipment (spraying equipment) and in selective deposition equipment, such as e.g. dip coating cells.

Typical whitening agents according to the invention are hexyl sulfate
hexyl sulfonate
2-ethylhexyl sulfate
heptyl sulfate
octyl sulfate
octyl sulfonate
decyl sulfate
decyl sulfonate
dodecyl sulfate
7-ethyl-2-methyl-4-undecanol sulfate
cyclohexyl sulfate
and isomers thereof.

These compounds can also be in the form of their salts.

The whitening agent according to the invention is conveniently used in a concentration range of 0.01 to 10 g/l in baths for the electrochemical deposition of rhodium coatings. Baths according to the invention containing the whitening agent according to formula I in a concentration of 0.1 to 6 g/l are particularly advantageous.

The brightness or degree of whiteness of the deposited coatings is unexpectedly significantly increased by the use according to the invention of the compounds the compounds having formula I as whitening agents in electroplating rhodium baths of otherwise conventional composition. The maximum coating thickness at which high-gloss deposition coatings can still be obtained is likewise significantly increased.

Many common and commercial electroplating rhodium baths, to which the corresponding quantity of compound having formula I is added, can be used as a basis for the production of the rhodium baths according to the invention.

The electroplating rhodium baths according to the invention typically contain approximately

| | |
|---|---|
| 0.1–20 g/l | rhodium as rhodium sulfate, phosphate, alkane sulfonate or sulfamate, |
| 10–200 g/l | sulfuric acid, phosphoric acid, amidosulfuric acid or mixtures of these acids, |
| 0–5 g/l | pyridine-3-sulfonic acid as brightening agent, |
| 0.01–2 g/l | wetting agent |
| 0.1–10 g/l | compound having formula I as whitening agent according to the invention. |

The baths are conventionally operated at current densities of 0.5–5 $A/dm^2$ (frame operation) and temperatures of up to 60° C.

The invention is clarified by means of the following examples:

Note: All brightness values ($L^*$) were measured in the CIE-$L^*a^*b^*$ system (1976) using an SP68S colorimeter from X-Rite.

EXAMPLE 1

Coatings having a current efficiency of 12.8% and a brightness $L^*=88.7$ are achieved on pre-nickel plated sheets measuring 25×40 mm (test set-up: 1 litre beaker, platinum-coated titanium anode, no movement, at a current density of 1 $A/dm^2$ in a rhodium electrolyte with 2 g/l rhodium in the form of rhodium phosphate 32 g/l sulfuric acid 0.2 g/l pyridine-3-sulfonic acid pH<1 temperature 40° C.

The coatings produced from this electrolyte can be deposited up to a maximum thickness of 0.3 μm without bloom.

The addition of 2 g/l octyl sulfonate reduces the current efficiency at 1 $A/dm^2$ only negligibly to 12.1% (1 $A/dm^2$), but increases the brightness to $L^*=89.8$. The coatings produced from this bath can now be deposited in a thickness of up to 0.5 μm without bloom.

EXAMPLE 2

Coatings having a current efficiency of 37.8% and a brightness $L^*=87.2$ are achieved on pre-nickel plated sheets measuring 25×40 mm (test set-up: 1 litre beaker, platinum-coated titanium anode, bath movement 200 rpm by means of a 60 mm magnetic stirring rod, product movement 5 cm/s, at a current density of 1 $A/dm^2$ in a rhodium electrolyte with 2 g/l rhodium in the form of rhodium sulfate 30 g/l sulfuric acid 0.2 g/l pyridine-3-sulfonic acid 20 mg/l wetting agent (fluorosurfactant)

pH<1 temperature 40° C.

At 2 $A/dm^2$ the current efficiency is still 26.3% and the brightness reaches a value of $L^*=86.3$. The coatings produced from this electrolyte can be deposited up to a maximum thickness of 0.3 μm without bloom.

The addition of 2 g/l 2-ethylhexyl sulfate reduces the current efficiency only negligibly to 37.1% (1 $A/dm^2$) and 26.0% (2 $A/dm^2$) but increases the brightness to $L^*=89.5$ (1 $A/dm^2$) and $L^*=90.0$ (2 $A/dm^2$). Furthermore, coatings can be deposited from this bath in a thickness of 0.7 μm without bloom. The electrolyte is very low foaming and is therefore supremely suitable for drum operation.

What is claimed is:

1. A bath for electrochemical deposition of high-gloss white rhodium coatings, wherein said bath comprises:

a. rhodium in dissolved form;

b. pyridine-3-sulfonic acid or naphthalene-trisulfonic acid as a brightening additive; and c. a whitening agent, wherein said whitening agent is a compound represented by the formula;

$R—SO_m—H$, wherein m=3 or 4, and

R is a straight-chain or branched chain or cyclic alkyl group having up to 20 C atoms.

2. A bath according to claim 1, wherein R is a straight-chain or branched chain alkyl group containing from 5 to 12 C atoms.

3. A bath according to claim 2, wherein said whitening agent is selected from the group consisting of hexyl sulfate, hexyl sulfonate, 2-ethylhexyl sulfate, heptyl sulfate, octyl sulfate, octyl sulfonate, decyl sulfate, decyl sulfonate, dodecyl sulfate, 7-ethyl-2-methyl-4-undeconal sulfate, cyclohexyl sulfate and isomers thereof.

4. A bath according to claim 2, wherein R is a branched chain alkyl group having from 6 to 10 C atoms.

5. A bath according to claim 1, wherein said whitening agent is selected from the group consisting of hexyl sulfate, hexyl sulfonate, 2-ethylhexyl sulfate, heptyl sulfate, octyl sulfate, octyl sulfonate, decyl sulfate, decyl sulfonate, dodecyl sulfate, 7-ethyl-2-methyl-4-undeconal sulfate, cyclohexyl sulfate and isomers thereof.

6. A bath according to claim 1, wherein said whitening agent is present in an amount of 0.01 to 10 g/l.

7. A bath according to claim 6, wherein said whitening agent is present in an amount of 0.01 to 6 g/l.

8. A method of using a whitening agent, wherein said whitening agent is a compound represented by the formula:

$R—SO_m—H$, wherein m=3 or 4

R is a straight-chain or branched chain or cyclic alkyl group having up to 20 C atoms, said method comprising adding said whitening agent to an electroplating bath, said bath comprising rhodium in dissolved form, and pyridine-3-sulfonic acid or naphthalene-trisulfonic acid as a brightening agent.

9. A method according to claim 8, further comprising adding a wetting agent to said bath.

* * * * *